(12) United States Patent
Mochizuki et al.

(10) Patent No.: US 9,564,562 B2
(45) Date of Patent: Feb. 7, 2017

(54) SILICONE COMPOSITION FOR SEALING SEMICONDUCTOR

(71) Applicant: MOMENTIVE PERFORMANCE MATERIALS JAPAN LLC, Tokyo (JP)

(72) Inventors: Kikuo Mochizuki, Tokyo (JP); Akira Takagi, Tokyo (JP)

(73) Assignee: MOMENTIVE PERFORMANCE MATERIALS JAPAN LLC, Tokyo (JP)

(*) Notice: Subject to any disclaimer, the term of this patent is extended or adjusted under 35 U.S.C. 154(b) by 0 days.

(21) Appl. No.: 14/730,810

(22) Filed: Jun. 4, 2015

(65) Prior Publication Data

US 2015/0270460 A1    Sep. 24, 2015

Related U.S. Application Data

(60) Division of application No. 14/091,841, filed on Nov. 27, 2013, now abandoned, which is a continuation of application No. PCT/JP2011/006287, filed on Nov. 10, 2011.

(30) Foreign Application Priority Data

May 31, 2011    (WO) ............... PCT/JP2011/003053

(51) Int. Cl.
| | |
|---|---|
| C08G 77/08 | (2006.01) |
| H01L 33/56 | (2010.01) |
| C08L 83/04 | (2006.01) |
| C08L 83/10 | (2006.01) |
| C08G 77/12 | (2006.01) |
| C08G 77/20 | (2006.01) |
| C08G 77/00 | (2006.01) |

(52) U.S. Cl.
CPC ............ *H01L 33/56* (2013.01); *C08L 83/04* (2013.01); *C08L 83/10* (2013.01); *C08G 77/12* (2013.01); *C08G 77/20* (2013.01); *C08G 77/80* (2013.01)

(58) Field of Classification Search
CPC ............................. C08L 83/04; C08G 77/20
See application file for complete search history.

(56) References Cited

U.S. PATENT DOCUMENTS

| 7,452,955 B2 | 11/2008 | Tanaka et al. |
| 7,566,756 B2 | 7/2009 | Kashiwagi |
| 8,569,429 B2 | 10/2013 | Hamamoto et al. |
| 2006/0081864 A1 | 4/2006 | Nakazawa |
| 2009/0099321 A1* | 4/2009 | Yoshitake ............ C08J 3/226 525/475 |
| 2009/0118440 A1 | 5/2009 | Nakanishi et al. |
| 2011/0092647 A1 | 4/2011 | Morita et al. |
| 2012/0126282 A1 | 5/2012 | Tanikawa et al. |

FOREIGN PATENT DOCUMENTS

| CN | 1798810 A | 7/2006 |
| CN | 101213257 A | 7/2008 |
| CN | 101981129 A | 2/2011 |
| CN | 102639643 A | 8/2012 |
| EP | 2 554 601 A1 | 2/2013 |
| JP | 2004-359756 | 12/2004 |
| JP | 2007-008996 | 1/2007 |
| JP | 2008-280367 | 11/2008 |
| JP | 2009-173789 | 8/2009 |
| JP | 2009-242627 | 10/2009 |
| JP | 2012-012524 | 1/2012 |
| KR | 10-0704883 | 4/2007 |
| KR | 10-2008-0031339 | 4/2008 |
| KR | 10-2011-0004373 | 1/2011 |
| KR | 10-2012-0024828 | 3/2012 |
| WO | WO 2004/107458 A2 | 12/2004 |
| WO | WO 2007/001039 A1 | 1/2007 |
| WO | WO 2009/122917 A1 | 10/2009 |
| WO | WO 2011/125463 A1 | 10/2011 |

OTHER PUBLICATIONS

International Search Report issued in related International Patent Application No. PCT/JP2011/006287 completed Feb. 20, 2012.
K. Mochizuki, U.S. PTO Official Action, U.S. Appl. No. 14/091,841, dated Nov. 17, 2014, 10 pages.
K. Mochizuki, U.S. PTO Official Action, U.S. Appl. No. 14/091,841, dated Mar. 5, 2015, 9 pages.

* cited by examiner

*Primary Examiner* — Margaret Moore
(74) *Attorney, Agent, or Firm* — Foley & Lardner LLP

(57) ABSTRACT

The silicone composition for sealing a semiconductor, comprises: (A) 100 parts of a polyorganosiloxane having one or more alkenyl groups, obtained by reacting (a1) 60 to 99 parts of an organosiloxane containing at least a trifunctional siloxane unit not taking part in a hydrosilylation reaction, with (a2) 40 to 1 parts of an organosiloxane containing a bifunctional siloxane unit having an alkenyl group and/or a monofunctional siloxane unit having an alkenyl group; (B) an amount of a polyorganohydrogensiloxane having two or more hydrogen atoms having a viscosity at 25° C. of 1 to 1000 mPa·s so that an amount of the hydrogen atoms is 0.5 to 3.0 mol per mol of the alkenyl groups; and (C) a platinum-based catalysts, wherein a decrease in storage modulus of a cured product thereof from 25° C. to 50° C. is 40% or more.
Specifically the polyorganosiloxane (A) is prepared by block or graft polymerization and equilibration reaction of three specific, different, organosiloxanes including a branched siloxane, a linear siloxane and a cyclic siloxane.

2 Claims, No Drawings

SILICONE COMPOSITION FOR SEALING SEMICONDUCTOR

CROSS-REFERENCE TO RELATED APPLICATIONS

This application is a divisional of U.S. application Ser. No. 14/091,841 filed Nov. 27, 2013, now abandoned, which is a continuation of prior International Application No. PCT/JP2011/006287 filed on Nov. 10, 2011, which is based upon and claims the benefit of priority from International Patent Application No. PCT/JP2011/003053 filed on May 31, 2011; the entire contents of all of which are incorporated herein by reference.

FIELD

The present invention relates to a silicone composition for sealing a semiconductor, and relates to a silicone composition suitable as a sealing material for sealing, for example, an optical semiconductor element such as an LED (light emitting diode).

BACKGROUND

An LED lamp known as the optical semiconductor device has a structure in which an LED die-bonded to a support substrate is sealed with a sealing material composed of transparent resin. As the sealing material, a composition mainly containing an epoxy resin has been conventionally used.

However, in use of an epoxy resin-based sealing material, due to an increase in heat generation and reduction of the wavelength of light in accordance with the recent increase in luminance of LED, cracking and yellowing have been likely to occur to cause a decrease in reliability. Hence, a composition containing silicone (polyorganosiloxane) as a main component is increasingly used because of its excellent heat resistance. In particular, an addition reaction type silicone composition is excellent in productivity because it cures in a short time by heating, and is thus suitable as the sealing material for LED. Further, a silicone cured product with high hardness is free from surface tack and thus has advantages such as capability of preventing adhesion of debris, adhesion between LEDs and the like.

However, the silicone cured product with high hardness is more fragile than the epoxy resin and generates cracks or peelings from the substrate during curing or in a reliability test of moisture absorption reflow.

As an adhesive, a potting agent, a protective coating agent, or an underfiller for the semiconductor element, there is proposed a curing silicone composition containing: (A) a solvent-soluble organopolysiloxane obtained by subjecting an organopolysiloxane having at least two alkenyl groups per molecule represented by an average composition formula: $R^1{}_a SiO_{(4-a)/2}$ (where $R^1$ represents a monovalent hydrocarbon group and 0.1 to 40 mol % of all of $R^1$s are alkenyl groups, a is a positive number satisfying $1 \leq a < 2$) to a hydrosilylation reaction, with diorganopolysiloxane represented by a general formula: $HR^2{}_2Si(R^2{}_2SiO)_n R^2{}_2SiH$ (where $R^2$ represents a monovalent hydrocarbon group containing no aliphatic unsaturated bond, n is an integer of 0 to 1,000); (B) an organohydrogenpolysiloxane represented by an average composition formula: $R^2{}_b H_c SiO_{(4-b-c)/2}$ (where $R^2$ is as described above, b and c are positive numbers satisfying $0.7 \leq b \leq 2.1$, $0.001 \leq c \leq 1.0$, and $0.8 \leq b+c \leq 2.6$); and (C) a hydrosilylation reaction catalyst (refer to JP-A 2009-242627 (KOKAI), for example).

However, a cured product obtained from the silicon composition described in JP-A 2009-242627 (KOKAI) is not so large in decrease in modulus due to heating, and thus cannot sufficiently relax the stress caused by thermal expansion of the cured product itself and has difficulty in preventing generation of cracks. Further, the solvent-soluble organopolysiloxane being the (A) component is prepared by the hydrosilylation reaction using a catalyst of the same kind as the hydrosilylation reaction catalyst being the (C) component and thus has a disadvantage that the stability after mixed with the (B) component degrades because of a remnant of the catalyst used for the preparation of the (A) component.

SUMMARY OF THE INVENTION

The present invention has been made to solve the problems and its object is to provide a silicone composition for sealing a semiconductor which forms a cured product having an appropriate modulus and can greatly decrease the modulus of the cured product by heating.

As a result of earnest study to achieve the above object, the present inventors have found that a great decrease in storage modulus of the cured product by heating is possible by using, as a base polymer, a polyorganosiloxane which contains siloxane units not taking part in the hydrosilylation reaction including a trifunctional unit at a predetermined percentage and contains a bifunctional siloxane unit and/or a monofunctional siloxane unit containing an alkenyl group, and reached the present invention.

Namely, a silicone composition for sealing a semiconductor of the present invention comprises: (A) 100 parts by weight of a polyorganosiloxane having one or more alkenyl groups, on average, per molecule, obtained by reacting (a1) 60 to 99 parts by weight of an organosiloxane containing at least a trifunctional siloxane unit represented by a formula: $R^1 SiO_{3/2}$ (where $R^1$ represents an alkyl group or an aryl group) and not taking part in a hydrosilylation reaction, with (a2) 40 to 1 parts by weight of an organosiloxane containing a bifunctional siloxane unit represented by a formula: $R^2{}_2 SiO_{2/2}$ (where $R^2$ represents an alkenyl group, an alkyl group, or an aryl group, and at least one of groups in a molecule is an alkenyl group) and/or a monofunctional siloxane unit represented by a formula: $R^2{}_3 SiO_{1/2}$ (where $R^2$ is as described above); (B) an amount of a polyorganohydrogensiloxane having two or more hydrogen atoms bonded to silicone atoms per molecule and having a viscosity at 25° C. of 1 to 1000 mPa·s so that an amount of the hydrogen atoms bonded to the silicon atoms is 0.5 to 3.0 mol per mol of the alkenyl groups bonded to silicon atoms in the (A) component; and (C) a catalyst amount of a platinum-based catalyst, wherein a decrease in storage modulus of a cured product thereof from 25° C. to 50° C. is 40% or more.

According to the silicone composition with the above structure, a cured product having an appropriate storage modulus and greatly decreased in storage modulus by heating can be formed, so that when the silicone composition is used as a sealing material for a semiconductor element such as an LED, the cured product can relax the stress caused by thermal expansion due to heat generation from the semiconductor element or the like. Consequently, it is possible to prevent generation of cracks and decrease peelings from the substrate so as to greatly improve the reliability of a semiconductor device.

DETAILED DESCRIPTION

Hereinafter, a silicone composition for sealing a semiconductor of the present invention will be described in detail.

[(A) Component]

The (A) component is a main component for imparting a large decrease in storage modulus of a cured product by heating (decrease of 40% or more by heating from 25° C. to 50° C.).

The (A) component is a polyorganosiloxane having one or more alkenyl groups, on average, per molecule, and obtained by reacting (a1) 60 to 99 parts by weight of an organosiloxane not taking part in a hydrosilylation reaction, with (a2) 40 to 1 parts by weight of an organosiloxane containing a bifunctional siloxane unit and/or a monofunctional siloxane unit, both the bifunctional siloxane unit and the monofunctional siloxane unit having an alkenyl group taking part in the hydrosilylation reaction. The (a2) component may contain one or both of the bifunctional siloxane unit having an alkenyl group and the monofunctional siloxane unit having an alkenyl group. Further, the (a2) component may contain a bifunctional siloxane unit and/or a monofunctional siloxane which contain no alkenyl group.

The (a1) organosiloxane not taking part in the hydrosilylation reaction contains at least a trifunctional siloxane unit represented by a formula: $R^1SiO_{3/2}$. Further, the (a2) bifunctional siloxane unit having an alkenyl group is represented by a formula: $R^2_2SiO_{2/2}$, and the monofunctional siloxane unit having an alkenyl group is represented by a formula: $R^2_3SiO_{1/2}$.

In these formulas, $R^1$ represents an alkyl group or an aryl group, $R^2$ represents an alkenyl group, an alkyl group, or an aryl group. Examples of the alkyl group include a methyl group, an ethyl group, a propyl group, an isopropyl group, a butyl group, an isobutyl group, a tert-butyl group, a hexyl group, a cyclohexyl group, an octyl group and the like, and the methyl group is more preferable. Examples of the aryl group include a phenyl group, a tolyl group and the like, and the phenyl group is more preferable. Examples of the alkenyl group include a vinyl group, an allyl group, a butenyl group, a pentenyl group, a hexenyl group and the like, and the vinyl group is more preferable.

Among $R^2$ contained in the bifunctional siloxane unit constituting (a2), at least one $R^2$ is an alkenyl group, and among $R^2$ contained in the monofunctional siloxane unit, at least one $R^2$ is an alkenyl group. Further, the (A) component has one or more alkenyl groups, on average, per molecule. From the viewpoint of increasing the refractive index of a cured product, it is preferable that 20 to 70 mol %, and more preferably 40 to 60 mol %, of all of organic groups bonded to silicon atoms in the (a1) component are phenyl groups.

Polyorganosiloxane being the (A) component is a polymer obtained, for example, by reacting a first organosiloxane represented by an average unit formula: $(R^1SiO_{3/2})_a(R^1_2SiO_{2/2})_b(R^1SiO_{(3-n)/2}Y_n)_c(R^1_2SiO_{(2-m)/2}Y_m)_d$, a second organosiloxane represented by a formula: $(R^2_3SiO_{1/2})_2(R^2_2SiO_{2/2})_e$, and a third organosiloxane represented by a formula: $(R^2_2SiO_{2/2})_f$, at a weight ratio (%) of g:h:i.

Note that in the above formulas, $R^1$ represents an alkyl group or an aryl group, $R^2$ represents an alkenyl group, an alkyl group, or an aryl group. Further, Y represents an alkoxy group or a hydroxyl group. Examples of the alkyl group, the aryl group, and the alkenyl group are the same as those in the above, and they are preferably the methyl group, the phenyl group, and the vinyl group respectively. Examples of the alkoxy group include a methoxy group, an ethoxy group, a propoxy group, a butoxy group and the like, and the methoxy group and the ethoxy group are more preferable.

Further, n is 1 or 2, and m is 1. More specifically, the siloxane unit represented by a formula: $R^1SiO_{(1-n)/2}Y_n$ is a bifunctional siloxane unit or a monofunctional siloxane unit, and the siloxane unit represented by a formula: $R^1_2SiO_{(2-m)/2}Y_m$ is a monofunctional siloxane unit.

Further, a and b are positive numbers, c and d are 0 or positive numbers, which are numbers satisfying $a+b+c+d=1.0$, $0.2<(a+c)/(a+b+c+d)<0.8$, $0.2<(b+d)/(a+b+c+d)<0.08$, $0\le c/(a+b+c+d)<0.15$, $0\le d/(a+b+c+d)<0.15$. Further, e is 0 or a positive number and f is a positive number, which are numbers satisfying $0\le e\le 100$, and $3\le f\le 20$.

Furthermore, g, h and i represent weight ratios (%) of first organosiloxane, second organosiloxane, and third organosiloxane respectively, and are numbers satisfying $60\le g\le 99$, $0\le h\le 20$, $0\le i\le 20$. They are numbers satisfying $g+h+i=100$ where h and i do not take 0 at the same time.

The bonding position of the alkenyl group is not limited. The alkenyl group may be bonded to a silicon atom of $R^2_3SiO_{1/2}$ unit, bonded to a silicon atom of $R^2_2SiO_{2/2}$ unit in $(R^2_2SiO_{2/2})_e$, or bonded to a silicon atom of $R^2_2SiO_{2/2}$ unit in $(R^2_2SiO_{2/2})_f$. Polyorganosiloxane being the (A) component represented by the aforementioned unit formula only needs to have one or more alkenyl groups, on average, per molecule.

The weight loss (weight loss on heating) of the (A) component after heating at 150° C. for 1 hour is preferably 3 weight % or less. In other words, the nonvolatile content after heating at 150° C. for 1 hour is preferably 97 weight % or more. The weight loss on heating of the (A) component exceeding 3 weight % is not preferable because generation of cracking during and after curing.

Polyorganosiloxane being the (A) component is preferably manufactured by subjecting, in a step (2), an organosiloxane (II) and/or an organosiloxane (III) which contain an alkenyl group to block polymerization or graft polymerization and equilibration reaction with a polyorganosiloxane (I) obtained in the following step (1).

The step (1) is a step of polymerizing (condensing), in the presence of a basic catalyst, a polyorganosiloxane obtained by hydrolyzing or partially hydrolyzing a silane compound represented by a formula: $R^1SiX_3$ and $R^1_2SiX_2$ under acid condition.

In the above formulas, $R^1$ represents an alkyl group or an aryl group. Examples of the alkyl group and the aryl group are the same as those in the above, and they are preferably the methyl group and the phenyl group respectively. X represents a halogen group, an alkoxy group or a hydroxyl group. Examples of the halogen group include a chloro group, a bromo group, a fluoro group and the like, and the chloro group is more preferable. Examples of the alkoxy group include a methoxy group, an ethoxy group, a propoxy group, a butoxy group and the like, and the methoxy group and the ethoxy group are more preferable.

As the basic catalyst, cesium hydroxide or the like can be used. Further, the heating temperature and time of the polymerizing (condensing) reaction are preferably set to 80° C. to 150° C. and three hours or longer.

Thus, the organosiloxane (I) represented by an average unit formula: $(R^1SiO_{3/2})_a(R^1_2SiO_{2/2})_b(R^1SiO_{(3-n)/2}Y_n)_c(R^1_2SiO_{(2-m)/2}Y_m)_d$ can be obtained. Note that all of a, b, n, m are positive numbers in the aforementioned ranges, and both of c and d are 0 or positive numbers in the aforementioned ranges.

The step (2) is a step of subjecting the polyorganosiloxane (I) represented by the above average unit formula obtained in the step (1) to block polymerization or graft polymerization and equilibration reaction, in the presence of a basic catalyst, with a linear polyorganosiloxane (II) containing an alkenyl group and/or a cyclic polyorganosiloxane (III) containing an alkenyl group.

Here, the linear polyorganosiloxane (II) is represented by a formula: $(R^2_3SiO_{1/2})_2(R^2_2SiO_{2/2})_e$, and the cyclic polyorganosiloxane (III) is represented by a formula: $(R^2_2SiO_{2/2})_f$. In the formulas, $R^2$ represents an alkenyl group, an alkyl group, or an aryl group. Examples of the alkyl group, the aryl group, and the alkenyl group are the same as those in the above, and they are preferably the methyl group, the phenyl group, and the vinyl group respectively. The bonding position of the alkenyl group is not limited. At least one of the linear polyorganosiloxane (II) and the cyclic polyorganosiloxane (III) only needs to have the alkenyl group.

As the basic catalyst, cesium hydroxide or the like can be used. Further, the heating temperature and time of the block polymerization and equilibration reaction or graft polymerization and equilibration reaction are preferably set to 130° C. to 150° C. and three hours or longer.

[(B) Component]

The (B) component is a cross-linking agent which is a polyorganohydrogensiloxane containing two or more, preferably, three or more hydrogen atoms bonded to silicon atoms per molecule (Si—H group). The number of silicon atoms per molecule is preferably 2 to 50, and more preferably 4 to 20.

As the (B) component, the one represented by an average composition formula: $R^3_xH_ySiO_{(4-(x+y))/2}$ is used. In the formula, $R^3$ represents a substituted or unsubstituted monovalent hydrocarbon group except an alkenyl group. Examples of $R^3$ include alkyl groups such as a methyl group, an ethyl group, a propyl group, an isopropyl group, a butyl group, an isobutyl group, a tert-butyl group, a hexyl group, a cyclohexyl group, and an octyl group; aryl groups such as a phenyl group and a tolyl group; aralkyl groups such as a benzyl group and a phenylethyl group; and any of these groups with part or all of hydrogen atoms being substituted by halogen atoms such as fluorine, chlorine, or bromine or by a cyano group, for example, hydrocarbon groups such as a chloromethyl group, a bromoethyl group, a trifluoropropyl group, a cyanoethyl group and the like having a carbon number of 1 to 12. Among them, an alkyl group having a carbon number of 1 to 4 is preferable and a methyl group is more preferable in view of easiness of synthesis and cost.

Both x and y are positive numbers satisfying $0.8 \leq x \leq 2.2$, $0.002 \leq y \leq 1$, $0.8 < x+y < 3$, and more preferably satisfying $1 \leq x \leq 2.2$, $0.01 \leq y \leq 1$, $1.8 \leq x+y \leq 2.5$.

The hydrogen atom may be bonded to a silicon atom at a terminal of a chain, bonded to a silicon atom at the middle of the chain, or bonded to both of them.

The molecular structure of the (B) component may be any of a straight chain, a branched chain, a cyclic chain and a three-dimensional network, and is preferably a three-dimensional network having a $R^3_2HSiO_{1/2}$ unit ($R^3$ is as described above) and a $SiO_{4/2}$ unit.

The viscosity of the (B) component at 25° C. is preferably equal to or less than 1000 mPa·s, and more preferably in a range of 1 to 500 mPa·s.

A compounding amount of the (B) component is set so that an amount of hydrogen atoms bonded to silicon atoms is 0.5 to 3.0 mol, more preferably, 0.7 to 2.0 mol, per mol of alkenyl groups bonded to the silicon atoms in the (A) component (alkenyl groups bonded to the silicon atoms in (a2)). If the compounding amount is less than 0.5 mol, sufficient crosslinking cannot be achieved On the other hand, if the compounding amount exceeds 3.0 mol, unreacted Si—H groups remain and tend to cause temporal change in physical property after curing.

[(C) Component]

A platinum-based catalyst being the (C) component is a catalyst to accelerate the hydrosilylation reaction between the alkenyl group in the (A) component and the hydrogen atom bonded to the silicon atom in the (B) component to accelerate curing of the composition. As the (C) component, a well-known platinum-based catalyst used for the hydrosilylation reaction can be used. Examples of the platinum-based catalyst include, platinum black, platinum chloride, chloroplatinic acid, a reactant of chloroplatinic acid and monohydric alcohol, complexes of chloroplatinic acid with olefins or vinylsiloxane, platinum bisacetoacetate and the like.

A compounding amount of the (C) component only needs to be an amount necessary for curing, and can be appropriately adjusted according to a desired curing rate or the like. Generally, the compounding amount may be, in terms of platinum element, from 0.5 to 300 ppm relative to the total weight of the composition and is preferably from 1 to 20 ppm in view of transparency of the cured product and cost.

[Other Optional Components]

In the silicone composition for sealing a semiconductor of the present invention, (D) an adhesion imparting agent can be compounded. As the (D) adhesion imparting agent, an organosilane or an organosiloxane oligomer having a number of silicon atoms of 2 to 50, and preferably 4 to 20 can be used. Examples of the (D) adhesion imparting agent are alkoxysilanes including: epoxy-functional group-containing alkoxysilanes such as γ-glycidoxypropyltrimethoxysilane, β-(3,4-epoxycyclohexyl)ethyltrimethoxysilane and the like; alkenyl group-containing alkoxysilanes such as vinyltrimethoxysilane, vinyltriethoxysilane, vinyltri(methoxyethoxy)silane and the like; amino group-containing alkoxysilanes such as γ-aminopropyltrimethoxysilane, γ-aminopropyltriethoxysilane, N-β(aminoethyl)-γ-aminopropyltrimethoxysilane, N-β(aminoethyl)-γ-aminopropylmethyldimethoxysilane, N-phenyl-γ-aminopropyltrimethoxysilane and the like; acryl group or methacryl group-containing alkoxysilanes such as γ-methacryloxypropyltrimethoxysilane, γ-acryloxypropyltrimethoxysilane and the like; and a mercapto group-containing alkoxysilane such as mercaptopropyltrimethoxysilane and the like.

Further, examples of the organosiloxane oligomer include a 1:1 addition reaction product of a SiH group-containing siloxane oligomer represented by:

[Chemical Formula 1]

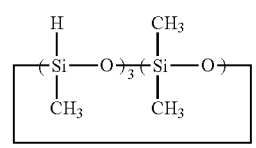

and γ-methacryloxypropyltrimethoxysilane represented by a formula:

$CH_2$=$C(CH_3)COO(CH_2)_3Si(OCH_3)_3$.

A compounding amount of the (D) adhesion imparting agent is preferably set to 10 parts by weight or less with respect to 100 parts by weight of the (A) component. The compounding amount exceeds 10 parts by weight leads to diseconomy in view of cost.

The silicone composition for sealing a semiconductor of the present invention can contain a reaction inhibitor, a reinforcing or non-reinforcing fine particle filler, a dye, a pigment, a flame retardant, a heat resistance improver, an anti-oxidation degradation agent, a wavelength adjusting agent, a solvent and so on as needed in a range not affecting the transparency after curing and not impairing the object of the present invention.

Examples of the manufacturing method of the silicone composition for sealing a semiconductor of the present invention, in which the order of addition of the components is not particularly limited, include a method of kneading the basic components (A) to (C) and the above-described optional components using a well-known kneading machine. It is also adoptable to store the silicone composition as two separate liquids and mix the two liquids before use. In this case, a mixture obtained by mixing the (A) component and the (C) component is regarded as a first liquid and a mixture obtained by mixing the (B) component and the other optional components (for example, a reaction inhibitor and so on) is regarded as a second liquid, and both of the liquids can be mixed together for use. Examples of the kneading machine include a planetary mixer, a three-roll, a kneader, a Shinagawa mixer and the like, which are provided with heating means and cooling means as needed and can be used independently or in combination.

The silicone composition for sealing a semiconductor of the present invention is preferably liquid and has a viscosity of 0.5 to 50 Pa·s at 25° C. If the viscosity exceeds 50 Pa·s, for example, workability when potting to an LED is deteriorated. On the other hand, if the viscosity is less than 0.5 Pa·s, liquid dripping is likely to occur in potting.

A method of curing the silicone composition for sealing a semiconductor is not particularly limited. Curing proceeds at room temperature or by heating at 50 to 200° C. It is preferable to perform heating in order to rapidly cure the silicone composition. In the case of heating, the heating time can be appropriately adjusted according to the heating temperature. The cured product is in the form of hard rubber or flexible resin.

The storage modulus of the cured product of the silicone composition of the present invention decreases 40% or more by heating from 25° C. to 50° C., preferably decreases 70% or more. Specifically, the storage modulus of the cured product at 50° C. is lower by 40% or more, and more preferably 70% or more, than the storage modulus at 25° C. Accordingly, when the silicone composition is used as a sealing material of a semiconductor element, the stress caused by thermal expansion due to generation of heat from the semiconductor element or the like can be relaxed to prevent cracks and peelings from a substrate. A cured product which decreases in storage modulus due to heating but shows a decreasing rate of the storage modulus is less than 40%, or a cured product which increases in storage modulus due to heating cannot prevent cracks and peelings from a substrate because it cannot sufficiently relax the stress caused by thermal expansion when used as the sealing material of the semiconductor element.

The storage modulus of the cured product can be appropriately controlled by changing the percentage (weight %) of the (a1) siloxane unit not taking part in the hydrosilylation reaction in the (A) component or the composition of the components (A) to (C). For example, it can be adjusted so that the storage modulus at 25° C. is $1 \times 10^6$ to $2 \times 10^7$ Pa, the storage modulus decreases 40 to 98% and more preferably 70 to 80% at 50° C. Note that the storage modulus can be measured by a viscoelasticity measuring apparatus. If the percentage of decrease in storage modulus at 50° C. is less than 40%, it is impossible to sufficiently prevent generation of cracks and peelings from a substrate because the stress caused by thermal expansion cannot be relaxed.

EXAMPLES

Hereinafter, the present invention will be described with reference to examples but is not limited to the described examples. In the following description, "Me" represents a methyl group, "Ph" represents a phenyl group, and "Vi" represents a vinyl group. Further the viscosity is a value at 25° C., and a weight average molecular weight is a value in terms of standard polystyrene measured by a gel permeation chromatography (GPC) using THF (tetrahydrofuran) as a solvent. A measurement and evaluation method of characteristics of silicone compositions obtained in examples and comparative examples is described below.

[Hardness]

The hardness was measured at 23° C. by a type A hardness meter.

[Storage Modulus]

The silicone composition (a diameter of 8 mm, a thickness of 1 mm) was set in an ARES viscoelasticity measuring device (manufactured by Reometric Scientific, Inc.) and raised in temperature by 50° C. per minute, then cured at 150° C. for 1 hour, and cooled at a rate of 5° C. per minute in a temperature range of 150° C. to −50° C., and its storage modulus was measured under conditions of a torsion strain of 0.5% and a frequency of 1 Hz.

[Package Test]

The silicone composition was filled a PPA (polyphthalamide) resin package (5×5×1 mm) using a syringe. The silicone composition was cured by heating at 100° C. for 3 hours and then heating at 150° C. for 1 hour. After cooling, the numbers of cracks and peelings were investigated using a microscope. Thereafter, the composition was subjected to moisture absorption at 85° C. and 85% RH for 3 hours and then heated in a reflow oven (Max 260° C.). After cooling, the number of cracks and peelings were investigated using a microscope.

Synthesis Example of Intermediate Product AA

Silicone Resin Having Methoxy Group

A mixture of 129 g (1 mol) of (Aa1) dimethyldichlorosilane, 255 g (1 mol) of (Aa2) diphenyldichlorosilane, and 212 g (1 mol) of (Aa3) phenyltrichlorosilane was subjected to cohydrolysis by dripping a methanol solution composed of 38 g of water and 237 g of methanol into the mixture. After the dripping, a resultant was heated at a reflux temperature of 60 to 70° C. for 30 minutes, and the cohydrolysis was completed. Thereafter, a reaction mixture was cooled and stirred for 15 minutes with addition of 254 g of methanol and then kept still standing for 30 minutes for liquid separation. A resultant was separated into a mixed solution of hydrochloric acid and methanol at an upper layer and a reaction product at a lower layer.

Subsequently, 254 g of methanol was added to the reaction product at the lower layer, and a resultant was subjected to heating and distillation to distill away the hydrochloric acid in the reaction product together with methanol. Thus, a silicone resin AA having methoxy groups represented by an average unit formula: $(Me_2SiO_{2/2})_{0.30}(Me_2SiO_{1/2}OMe)_{0.03}$ $(Ph_2SiO_{2/2})_{0.30}(Ph_2SiO_{1/2}OMe)_{0.04}(PhSiO_{3/2})_{0.27}\{PhSiO_{1/2}(OMe)_2\}_{0.03}(PhSiO_{2/2}OMe)_{0.03}$ was obtained.

In the average unit formula representing the silicone resin AA, (aa1) a unit: $(Me_2SiO_{2/2})_{0.30}(Me_2SiO_{1/2}OMe)_{0.03}$ was generated from the starting material (Aa1), (aa2) a unit: $(Ph_2SiO_{2/2})_{0.30}(Ph_2SiO_{1/2}OMe)_{0.04}$ was generated from the starting material (Aa2), (aa3) a unit: $(PhSiO_{3/2})_{0.27}\{PhSiO_{1/2}(OMe)_2\}_{0.03}(PhSiO_{2/2}OMe)_{0.03}$ was generated from the starting material (Aa3). The molar ratio of the units is (aa1):(aa2):(aa3)=0.33:0.34:0.33≈1:1:1.

Synthesis Example of Intermediate Product BB

Silicone Resin Having Silanol Group 400 g of xylene, 214.2 g (1.4 mol) of methyltrichlorosilane, 34.1 g (0.26 mol) of dimethyldichlorosilane, 282.4 g (1.1 mol) of diphenyldichlorosilane, and 454.0 g (2.1 mol) of phenyltrichlorosilane were charged into a flask and mixed to prepare a xylene solution of organosilane. Further, 1950 g of ion-exchanged water, 850 g of acetone, and 245 g of methanol were charged into another flask to prepare a mixed solution. While this mixed solution was being stirred, the xylene solution of organosilane was dripped into the mixed solution over 30 minutes, the stirring was continued for 10 minutes after the finish of the dripping for hydrolysis. Thereafter, a resultant was transferred to a separating funnel and kept still standing for 45 minutes for liquid separation. The resultant was separated into a xylene solution of silicone resin having silanol groups at an upper layer and a hydrochloric acid solution at a lower layer.

Subsequently, the hydrochloric acid solution at the lower layer was removed, the xylene solution of silanol group-containing resin at the upper layer was returned back to the flask and heated with 1200 g of ion-exchanged water added thereto, and a mixture was subjected to a heat water-washing operation at a reflux temperature (70 to 80° C.) thereof for 10 minutes. Thereafter, the mixture was returned back to the separating funnel and kept still standing for 45 minutes to separate into a xylene solution of silanol group-containing resin at an upper layer and a hydrochloric acid solution at a lower layer. The same operation was repeated, and it was confirmed that the hydrochloric acid content in the xylene solution of silanol group-containing resin reached 0.1 ppm or less.

Thus obtained xylene solution of silanol group-containing resin was heated under a reduced pressure condition to distill away a solvent, and a non-volatile content (the non-volatile content was measured by heating at 105° C. for 3 hours) was concentrated to 65 weight %, and xylene was then added thereto to adjust the non-volatile content to 60 weight %. Thus, a silicone resin BB having silanol groups represented by an average unit formula: $(Me_2SiO_{2/2})_{0.04}(Me_2SiO_{1/2}OH)_{0.01}(MeSiO_{3/2})_{0.23}(MeSiO_{2/2}OH)_{0.01}\{MeSiO_{1/2}(OH)_2\}_{0.03}(Ph_2SiO_{2/2})_{0.20}(Ph_2SiO_{1/2}OH)_{0.03}(PhSiO_{3/2})_{0.37}(PhSiO_{2/2}OH)_{0.03}\{PhSiO_{1/2}(OH)_2\}_{0.03}$ was obtained.

Synthesis Example 1

Synthesis of Silicone Resin A1

(First Step)

700 g of xylene was added to 255 g of the intermediate product AA (silicone resin having methoxy groups) for dilution, and a dilution was subjected to hydrolysis by adding 0.6 g of cesium hydroxide solution with a concentration of 50 weight % (hereinafter, indicated only by 50%) and 200 g of water thereto and heating. The reaction was continued until characteristic absorption due to the methoxy groups at a wave number of 2800 cm$^{-1}$ disappeared in infrared absorption spectrum measurement. Thus, a xylene solution of a silicone resin polymer having no methoxy group represented by an average molecular formula (unit formula: $(Me_2SiO_{2/2})_{0.33}(Ph_2SiO_{2/2})_{0.34}(PhSiO_{3/2})_{0.33}$ was obtained.

(Second Step)

To the reaction product obtained in the first step, 15 g of polyphenylsiloxane having vinyl groups at both terminals (Vi amount of 0.43 mmol/g) and 30 g of cyclic polymethylvinylsiloxane (Vi amount of 11.6 mmol/g) were added, and a resultant was reacted at a xylene reflux temperature for 5 hours for graft polymerization and equilibrium. After cooling, 0.3 g of trimethylchlorosilane was added for neutralization, an operation (water-washing operation) of washing the xylene solution with water and removing a water layer by a liquid separation was performed. After the water layer was neutralized by repeating the water-washing operation, water remaining in a xylene layer was removed by subjecting the water and xylene to azeotropy. After the xylene layer dehydrated was filtrated, a silicone resin A1 was obtained by distilling xylene away under reduced pressure.

The silicone resin A1 was obtained by reacting an organosiloxane G represented by an average unit formula: $(Me_2SiO_{2/2})_{0.33}(Ph_2SiO_{2/2})_{0.34}(PhSiO_{3/2})_{0.33}$, an organosiloxane H represented by a formula: $(Me_2ViSiO_{1/2})_2(Ph_2SiO_{2/2})_{15}(Me_2SiO_{2/2})_{20}$, and an organosiloxane I represented by a formula: $(MeViSiO_{2/2})_4$ at a weight ratio (%) of G:H:I=85:5:10 in terms of charge amount base.

In the second step, a polyphenylsiloxane having vinyl groups at both terminals and a cyclic methylvinylsiloxane split and graft-polymerized with the reaction product obtained in the first step, whereby the silicone resin A1 was obtained.

The silicone resin A1 had a viscosity of 120 Pa·s, a non-volatile content measured after heated at 150° C. for 1 hour of 99.0 weight % (hereinafter, indicated only by %, and meaning a weight loss on heating of 1.0%), a weight average molecular weight of 1056, and a degree of dispersion of 1.35. The degree of dispersion is a numerical value representing the molecular weight distribution and obtained by a weight average molecular weight (Mw)/number average molecular weight (Mn). The degree of dispersion means that as it becomes closer to 1, the molecular weight distribution is narrower. Note the number of vinyl groups per molecule in the silicone resin A1 is 1.2 on average.

Synthesis Example 2

Synthesis of Silicone Resin A2

(First Step)

300 g of xylene was added to 595 g of the intermediate product AA (silicone resin having methoxy groups) for dilution, and a dilution was subjected to hydrolysis by adding 0.7 g of 50% cesium hydroxide solution and 200 g of water thereto and heating. The reaction was continued until characteristic absorption due to the methoxy groups at 2800 cm$^{-1}$ disappeared, in infrared absorption spectrum measurement.

(Second Step)

To the reaction product obtained in the first step, 70 g of polyphenylsiloxane having vinyl groups at both terminals (Vi amount of 0.43 mmol/g) and 35 g of cyclic polymethylvinylsiloxane (Vi amount of 11.6 mmol/g) were added, and a resultant was reacted at a xylene reflux temperature for 5 hours for graft polymerization and equilibrium. After cooling, 0.5 g of trimethylchlorosilane was added for neutralization, an operation (water-washing operation) of washing the xylene solution with water and removing a water layer by a liquid separation was performed. After the water layer was neutralized by repeating the water-washing operation, water remaining in a xylene layer was removed by subjecting the water and xylene to azeotropy. Thus, after the xylene layer dehydrated was filtrated, a silicone resin A2 was obtained by distilling xylene away under reduced pressure.

The silicone resin A2 was obtained by reacting an organosiloxane G represented by an average unit formula: $(Me_2SiO_{2/2})_{0.33}(Ph_2SiO_{2/2})_{0.34}(PhSiO_{3/2})_{0.33}$, an organosiloxane H represented by a formula: $(Me_2ViSiO_{1/2})_2(Ph_2SiO_{2/2})_{15}(Me_2SiO_{2/2})_{20}$, and an organosiloxane I represented b a formula: $(MeViSiO_{2/2})_4$ at a weight ratio (%) of G:H:I=85:10:5 in terms of charge amount base.

In the second step, a polyphenylsiloxane having vinyl groups at both terminals and a cyclic methylvinylsiloxane split and graft-polymerized with the reaction product obtained in the first step, whereby the silicone resin A2 was obtained.

The obtained silicone resin A2 had a viscosity of 7500 Pa·s, a non-volatile content measured after heated at 150° C. for 1 hour of 99.0%, a weight average molecular weight of 2950, and a degree of dispersion of 2.05. Note the number of vinyl groups per molecule in the silicone resin A2 is 1.8 on average.

Synthesis Example 3

Synthesis of Silicone Resin A3

30 g of cyclic polymethylvinylsiloxane (Vi amount of 11.6 mmol/g) was added to 270 g of the intermediate product AA (silicone resin having methoxy groups), and then 700 g of xylene was added to them for dilution. 0.3 g of 50% cesium hydroxide solution was added to a dilution, and a resultant was heated and reacted at a xylene reflux temperature for 5 hours for block polymerization and equilibrium. After cooling, 0.3 g of trimethylchlorosilane was added for neutralization, an operation (water-washing operation) of washing the xylene solution with water and removing a water layer by a liquid separation operation was performed. After the water layer was neutralized by repeating the water-washing operation, water remaining in a xylene layer was removed by subjecting the water and xylene to azeotropy. Thus, after the xylene layer dehydrated was filtrated, a silicone resin A3 was obtained by distilling xylene away under reduced pressure.

The silicone resin A3 was obtained by reacting an organosiloxane G represented by an average unit formula: $(Me_2SiO_{2/2})_{0.30}(Me_2SiO_{1/2}OMe)_{0.03}(Ph_2SiO_{2/2})_{0.30}(Ph_2SiO_{1/2}OMe)_{0.04}(Ph_2SiO_{3/2})_{0.27}\{PhSiO_{1/2}(OMe)_2\}_{0.03}(PhSiO_{2/2}OMe)_{0.03}$, and an organosiloxane I represented by a formula: $(MeViSiO_{2/2})_4$ at a weight ratio (%) of G:I=90:10 in terms of charge amount base.

The obtained silicone resin A3 had a viscosity of 0.6 Pa·s, a non-volatile content measured after heated at 150° C. for 1 hour of 99.0%, a weight average molecular weight of 870, and a degree of dispersion of 1.24. Note the number of vinyl groups per molecule in the silicone resin A3 is 1.0 on average.

Synthesis Example 4

Synthesis of Silicone Resin A4

30 g of cyclic polymethylvinylsiloxane (Vi amount of 11.6 mmol/g) was added to 450 g (270 g of effective resin content) of an intermediate product BB (silicone resin having silanol groups), and 230 g of xylene was added to them for dilution. 0.3 g of 50% cesium/potassium hydroxide solution was added to a dilution, and a resultant was heated and reacted at a xylene reflux temperature for 5 hours for block polymerization and equilibrium. After cooling, 0.7 g of trimethylchlorosilane was added for neutralization, an operation (water-washing operation) of washing the xylene solution with water and removing a water layer by a liquid separation was performed. After the water layer was neutralized by repeating the water-washing operation, water remaining in a xylene layer was removed by subjecting the water and xylene to azeotropy. Thus, after the xylene layer dehydrated was filtrated, a silicone resin A4 was obtained by distilling xylene away under reduced pressure.

The silicone resin A4 was obtained by reacting an organosiloxane G represented by an average unit formula: $(Me_2SiO_{2/2})_{0.05}(MeSiO_{3/2})_{0.29}(Ph_2SiO_{2/2})_{0.23}(Ph_2SiO_{3/2})_{0.43}$, and an organosiloxane I represented by a formula: $(MeViSiO_{2/2})_4$ at a weight ratio (%) of G:I=90:10 in terms of charge amount base.

The silicone resin A4 had a non-volatile content measured after heated at 150° C. for 1 hour of 99.0%, a weight average molecular weight of 1550, and a degree of dispersion of 1.49. Note the number of vinyl groups per molecule in the silicone resin A4 is 1.8 on average.

Synthesis Example 5

Synthesis of Silicone Resin A5

(First Step)

300 g of xylene was added to 490 g of the intermediate product AA (silicone resin having methoxy groups) for dilution, and a dilution was subjected to hydrolysis by adding 1.4 g of 50% cesium/potassium hydroxide solution and 200 g of water thereto and heating. The hydrolysis reaction was continued until characteristic absorption due to the methoxy groups at 2800 $cm^{-3}$ disappeared in infrared absorption spectrum measurement.

(Second Step)

To the reaction product obtained in the first step, 140 g of polyphenylsiloxane having vinyl groups at both terminals (Vi amount of 0.43 mmol/g) and 70 g of cyclic polymethylvinylsiloxane (Vi amount of 11.6 mmol/g) were added, and a resultant was reacted at a xylene reflux temperature for 5 hours for graft polymerization and equilibrium. After cooling, 1.3 g of trimethylchlorosilane was added for neutralization, an operation (water-washing operation) of washing the xylene solution with water and removing a water layer by a liquid separation was performed. After the water layer was neutralized by repeating the water-washing operation, water remaining in a xylene layer was removed by subjecting the water and xylene to azeotropy. Thus, after the xylene layer dehydrated was filtrated, a silicone resin A5 was obtained by distilling xylene away under reduced pressure.

The silicone resin A5 was obtained by reacting an organosiloxane G represented by an average unit formula: $(Me_2SiO_{2/2})_{0.33}(Ph_2SiO_{2/2})_{0.34}(PhSiO_{3/2})_{0.33}$, an organosiloxane H represented by a formula: $(Me_2ViSiO_{1/2})_2(Ph_2SiO_{2/2})_{15}(Me_2SiO_{2/2})_{20}$, and an organosiloxane I represented by a formula: $(MeViSiO_{2/2})_4$ at a weight ratio (%) of G:H:I=70:20:10 in terms of charge amount base.

In the second step, a polyphenylsiloxane having vinyl groups at both terminals and a cyclic methylvinylsiloxane split and graft-polymerized with the reaction product obtained in the first step, whereby the silicone resin A5 was obtained.

The silicone resin A5 had a viscosity of 100 Pa·s, a non-volatile content measured after heated at 150° C. for 1 hour of 98.0%, a weight average molecular weight of 3370, and a degree of dispersion of 2.40. Note the number of vinyl groups per molecule in the silicone resin A5 is 4.2 on average.

Synthesis Example 6

Synthesis of Silicone Resin A6

800 g of xylene and 2000 g of ion-exchanged water were charged into a flask and heated while being stirred until reaching 80° C. Then, a mixed solution of 356.1 g of phenyltrichlorosilane, 688.5 g of diphenyldichlorosilane, 86.4 g of vinylmethyldichlorosilane, and 6.6 g of dimethyldichlorosilane was dripped into the above over 3 hours and subjected to hydrolysis at 80° C. Thereafter, a resultant was transferred to a separating funnel and kept still standing for 45 minutes for liquid separation. The resultant was separated into a xylene solution of silicone resin at an upper layer and a hydrochloric acid solution at a lower layer.

Subsequently, the hydrochloric acid solution at the lower layer was removed, and the xylene solution of silicone resin at the upper layer was returned back to the flask and heated with 1000 g of ion-exchanged water added thereto, and a resultant was subjected to a water-washing operation while being heated at 70 to 80° C. for 10 minutes. Then, the mixture was transferred to the separating funnel and kept still standing for 45 minutes to separate into a xylene solution of silicone resin at an upper layer and a hydrochloric acid solution at a lower layer. The same operation was repeated, and it was confirmed that the hydrochloric acid content in the xylene solution of silicone resin reached 0.1 ppm or less. Thereafter, the xylene amount was controlled to adjust the non-volatile content to 50%.

1400 g (700 g of effective resin content) of the obtained xylene solution of silicone resin was mixed with 150 g of hexamethyldisilazane and 90 g of trimethylchlorosilane, and a mixture was subjected to silylation of hydroxyl groups at 80° C. The reaction was continued until characteristic absorption due to the hydroxyl groups near 3600 $cm^{-1}$ disappeared in infrared absorption spectrum measurement. Thereafter, 500 g of water was added to a reaction solution, and a resultant was subjected to a water-washing operation while being heated to 70 to 80° C. for 10 minutes. Then, the mixture was transferred to the separating funnel and kept still standing for 45 minutes to separate into a xylene solution of silicone resin at an upper layer and a basic solution at a lower layer. The same operation was repeated. After the water layer was neutralized, water remaining in a xylene layer was removed by subjecting the water and xylene to azeotropy. Thus, after the xylene layer dehydrated was filtrated, xylene was distilled away under reduced pressure, whereby a silicone resin A6 represented by an average unit formula: $(Me_2SiO_{2/2})_{0.01}(MeViSiO_{2/2})_{0.11}(Ph_2SiO_{2/2})_{0.48}(PhSiO_{1/2})_{0.27}(Me_3SiO_{1/2})_{0.13}$ was obtained.

The silicone resin A6 had a viscosity of 200 Pa·s, a non-volatile content measured after heated at 150° C. for 1 hour of 99.4%, a weight average molecular weight of 1905, and a degree of dispersion of 1.52. Note the number of vinyl groups per molecule in the silicone resin A6 is 1.4 on average.

Example 1

A silicone composition for sealing a semiconductor was obtained by adding (B) 9 parts by weight of a polyorganohydrogensiloxane having a viscosity of 20 mPa·s and represented by an average unit formula: $(SiO_2)[H(CH_3)_2SiO_{1/2}]_2$ and (C) 3 ppm of a vinyl dimer platinum complex in terms of platinum amount of 100 ppm by weight of the silicone resin A1 obtained in the synthesis example 1 and kneading them. Characteristics of the composition were measured and results were shown in Table 1. Note that, in Table 1, an H/Vi ratio shows the molar ratio between hydrogen atoms bonded to silicon atoms and vinyl groups bonded to silicon atoms in the (A) component and the (B) component.

Further in Table 1 and later-described Table 2 and Table 3, $M^H_2Q$ is a polyorganohydrogensiloxane represented by an average unit formula: $(SiO_2)[H(CH_3)_2SiO_{1/2}]_2$ and $M^H_2D^{Ph2}$ is a polyorganohydrogensiloxane represented by a formula: $[H(CH_3)_2SiO_{1/2}]_2[(C_6H_5)_2SiO_{2/2}]$. Further, $M^{Vi}D^{Ph}{}_{15}D_{20}M^{Vi}$ is a linear polyorganosiloxane represented by a formula: $(Me_2ViSiO_{1/2})_2(Ph_2SiO_{2/2})_{15}(Me_2SiO_{2/2})_{20}$ used in later-described comparative examples 1 to 4.

Examples 2 to 5

Silicone compositions for sealing a semiconductor were obtained by compounding the silicone resins A2 to A5 obtained in the synthesis examples 2 to 5, (B) a polyorganohydrogensiloxane represented by an average unit formula: $(SiO_2)[H(CH_3)_2SiO_{1/2}]_2$, and (C) a vinyl dimer platinum complex at compositions shown in Table 1 respectively and kneading them. Characteristics of the compositions were measured and results were shown in Table 1.

Examples 6 to 10

Silicone compositions for sealing a semiconductor were obtained by compounding the silicone resins A1 to A5 obtained in the synthesis examples 1 to 5, (B) a polyorganohydrogensiloxane represented by an average unit formula: $(SiO_2([H(CH_3)_2SiO_{1/2}]_2$, (C) a vinyl dimer platinum complex, and adhesion imparting agents (D1), (D2) at compositions shown in Table 2 respectively and kneading them. Characteristics of the compositions were measured and results were shown in Table 2.

Note that a 1:1 addition reaction product of a SiH group-containing siloxane oligomer represented by a formula

[Chemical Formula 2]

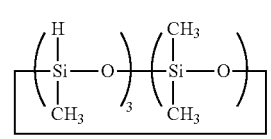

and a γ-methacryloxypropyltrimethoxysilane was used as the adhesion imparting agent (D1), and a γ-glycidoxypropyltrimethoxysilane (brand name TSL8350, manufactured by Momentive Performance Material Japan LLC) was used as the adhesion imparting agent (D2). An H/Vi ratio in Table 2 shows the molar ratio between hydrogen atoms bonded to silicon atoms and vinyl groups bonded to silicon atoms in the (A) component and the (B) component except the adhesion imparting agent (D1).

Example 11

A silicone composition for sealing a semiconductor was obtained by compounding the silicone resin A1 obtained in the synthesis example 1, (B) a polyorganohydrogensiloxane (viscosity of 20 mPa·s) represented by an average unit formula: $(SiO_2)[H(CH_3)_2SiO_{1/2}]_2$, and a polyorganohydrogensiloxane (viscosity of 10 mPa·s) represented by a formula: $[H(CH_3)_2SiO_{1/2}]_2[(C_6H_5)_2SiO_{2/2}]$, and (C) a vinyl dimer platinum complex at a composition shown in Table 1 and kneading them. Characteristics of the composition were measured and results were shown in Table 1.

Example 12

A silicone composition for sealing a semiconductor was obtained by compounding the silicone resin A1 obtained in the synthesis example 1, (B) a polyorganohydrogensiloxane (viscosity of 20 mPa·s) represented by an average unit formula: $(SiO_2)[H(CH_3)_2SiO_{1/2}]_2$, and a polyorganohydrogensiloxane (viscosity of 10 mPa·s) represented by a formula: $[H(CH_3)_2SiO_{1/2}]_2[(C_6H_5)_2SiO_{2/2}]$, (C) a vinyl dimer platinum complex, and adhesion imparting agents (D1), (D2) at a composition shown in Table 2 and kneading them. Characteristics of the composition were measured and results were shown in Table 2.

Comparative Example 1

A silicone composition for sealing a semiconductor was obtained by compounding the silicone resin A6 obtained in the synthesis example 6, a linear polyorganosiloxane represented by a formula: $(Me_2ViSiO_{1/2})_2(Ph_2SiO_{2/2})_{15}(Me_2SiO_{2/2})_{20}$, (B) a polyorganohydrogensiloxane represented by an average unit formula: $(SiO_2)[H(CH_3)_2SiO_{1/2}]_2$, and (C) a vinyl dimer platinum complex at a composition shown in Table 3 and kneading them. Characteristics of the composition were measured and results were shown in Table 3.

Comparative Example 2

A silicone composition for sealing a semiconductor was obtained by compounding a linear polyorganosiloxane represented by a formula: $(Me_2ViSiO_{1/2})_2(Ph_2SiO_{2/2})_{15}(Me_2SiO_{2/2})_{20}$, (B) a polyorganohydrogensiloxane represented by an average unit formula: $(SiO_2)[H(CH_3)_2SiO_{1/2}]_2$, and (C) a vinyl dimer platinum complex at a composition shown in Table 3 and kneading them. Characteristics of the composition were measured and results were shown in Table 3.

Comparative Examples 3, 4

Silicone compositions for sealing a semiconductor were obtained by compounding the silicone resin A6 obtained in the synthesis example 6, a linear polyorganosiloxane represented by a formula: $(Me_2ViSiO_{1/2})_2(Ph_2SiO_{2/2})_{15}(Me_2SiO_{2/2})_{20}$, (B) a polyorganohydrogensiloxane represented by an average unit formula: $(SiO_2)[H(CH_3)_2SiO_{1/2}]_2$, (C) a vinyl dimer platinum complex, and adhesion imparting agents (D1), (D2) at compositions shown in Table 3 respectively and kneading them. Characteristics of the compositions were measured and results were shown in Table 3. Note that an H/Vi ratio in Table 3 shows the molar ratio between hydrogen atoms bonded to silicon atoms and vinyl groups bonded to silicon atoms in the (A) component and the (B) component except the adhesion imparting agent (D1).

TABLE 1

| | | | Example 1 | Example 2 | Example 3 | Example 4 | Example 5 | Example 11 |
|---|---|---|---|---|---|---|---|---|
| Composition (parts by weight) | (A) component | Silicone resin A1 | 100 | | | | 80 | 100 |
| | | Silicone resin A2 | | 80 | | | | |
| | | Silicone resin A3 | | 20 | 55 | | 20 | |
| | | Silicone resin A4 | | | 45 | | | |
| | | Silicone resin A5 | | | | 100 | | |
| | | Silicone resin A6 $M^{Vi}D^{Ph}_{15}D_{20}M^{Vi}$ | | | | | | |
| | (B) | $M^H{}_2Q$ | 9 | 7 | 15 | 12 | 19 | 18 |
| | | $M^H{}_2D^{Ph2}$ | | | | | | 9 |
| | (C) | Pt catalyst | 3 ppm | 3 ppm | 3 ppm | 3 ppm | 3 ppm | 3 ppm |
| | H/Vi ratio in (A) and (B) | | 0.8 | 1.0 | 1.3 | 1.0 | 1.7 | 2.0 |
| Characteristics | Hardness (Type A) | | 80 | 70 | 85 | 80 | 90 | 85 |
| | Storage modulus (Pa) | 25° C. | $2 \times 10^6$ | $1 \times 10^6$ | $1 \times 10^6$ | $4 \times 10^6$ | $2 \times 10^7$ | $9 \times 10^6$ |
| | | 50° C. | $5 \times 10^4$ | $2 \times 10^5$ | $2 \times 10^6$ | $2 \times 10^6$ | $2 \times 10^6$ | $3 \times 10^5$ |
| | | 60° C. | $4 \times 10^4$ | $2 \times 10^5$ | $2 \times 10^6$ | $2 \times 10^6$ | $2 \times 10^6$ | $3 \times 10^5$ |
| | | 100° C. | $4 \times 10^4$ | $3 \times 10^5$ | $3 \times 10^6$ | $2 \times 10^6$ | $3 \times 10^6$ | $3 \times 10^5$ |
| | | Decrease in modulus | observed | observed | observed | observed | observed | observed |
| | Number of generated cracks and peelings | After curing | 0 | 0 | 0 | 0 | 0 | 0 |
| | | After moisture absorption reflow | 0 | 0 | 0 | 0 | 0 | 0 |

TABLE 2

|  |  |  | Example 6 | Example 7 | Example 8 | Example 9 | Example 10 | Example 12 |
|---|---|---|---|---|---|---|---|---|
| Composition (parts by weight) | (A) component | Silicone resin A1 | 100 |  |  |  | 80 | 100 |
|  |  | Silicone resin A2 |  | 80 |  |  |  |  |
|  |  | Silicone resin A3 |  | 20 | 55 |  | 20 |  |
|  |  | Silicone resin A4 |  |  | 45 |  |  |  |
|  |  | Silicone resin A5 |  |  |  | 100 |  |  |
|  |  | Silicone resin A6 |  |  |  |  |  |  |
|  |  | $M^{Vi}D^{Ph}{}_{15}D_{20}M^{Vi}$ |  |  |  |  |  |  |
|  | (B) | $M^H{}_2Q$ | 9 | 7 | 15 | 12 | 19 | 18 |
|  |  | $M^H{}_2D^{Ph2}$ |  |  |  |  |  | 9 |
|  | (C) | Pt catalyst | 3 ppm | 3 ppm | 3 ppm | 3 ppm | 3 ppm | 3 ppm |
|  |  | Adhesion imparting agent D1 | 0.9 | 0.9 | 0.9 | 0.9 | 0.9 | 0.0 |
|  |  | Adhesion imparting agent D2 | 0.3 | 0.3 | 0.3 | 0.3 | 0.3 | 0.3 |
|  | H/Vi ratio in (A) and (B) |  | 0.8 | 1.0 | 1.3 | 1.0 | 1.7 | 2.0 |
| Characteristics | Hardness (Type A) |  | 78 | 68 | 84 | 79 | 88 | 83 |
|  | Storage modulus (Pa) | 25° C. | $2 \times 10^6$ | $1 \times 10^6$ | $1 \times 10^7$ | $4 \times 10^6$ | $2 \times 10^7$ | $9 \times 10^6$ |
|  |  | 50° C. | $5 \times 10^4$ | $2 \times 10^6$ | $2 \times 10^6$ | $2 \times 10^6$ | $2 \times 10^6$ | $3 \times 10^6$ |
|  |  | 60° C. | $4 \times 10^4$ | $2 \times 10^5$ | $2 \times 10^6$ | $2 \times 10^6$ | $2 \times 10^6$ | $3 \times 10^5$ |
|  |  | 100° C. | $4 \times 10^4$ | $3 \times 10^5$ | $3 \times 10^6$ | $2 \times 10^6$ | $3 \times 10^6$ | $3 \times 10^5$ |
|  |  | Decrease in modulus | observed | observed | observed | observed | observed | observed |
|  | Number of generated cracks and peelings | After curing | 0 | 0 | 0 | 0 | 0 | 0 |
|  |  | After moisture absorption reflow | 0 | 0 | 0 | 1 | 0 | 0 |

TABLE 3

|  |  |  | Comparative Example 1 | Comparative Example 2 | Comparative Example 3 | Comparative Example 4 |
|---|---|---|---|---|---|---|
| Composition (parts by weight) | (A) component | Silicone resin A1 |  |  |  |  |
|  |  | Silicone resin A2 |  |  |  |  |
|  |  | Silicone resin A3 |  |  |  |  |
|  |  | Silicone resin A4 |  |  |  |  |
|  |  | Silicone resin A5 |  |  |  |  |
|  |  | Silicone resin A6 | 40 |  | 40 |  |
|  |  | $M^{Vi}D^{Ph}{}_{15}D_{20}M^{Vi}$ | 60 | 100 | 60 | 100 |
|  | (B) | $M^H{}_2Q$ | 9 | 6 | 9 | 6 |
|  |  | $M^H{}_2D^{Ph2}$ |  |  |  |  |
|  | (C) | Pt catalyst | 3 ppm | 3 ppm | 3 ppm | 3 ppm |
|  |  | Adhesion imparting agent D1 |  |  | 0.9 | 0.9 |
|  |  | Adhesion imparting agent D2 |  |  | 0.3 | 0.3 |
|  | H/Vi ratio in (A) and (B) |  | 1.7 | 1.4 | 1.7 | 1.4 |
| Characteristics | Hardness (Type A) |  | 60 | 30 | 59 | 29 |
|  | Storage modulus (Pa) | 25° C. | $8 \times 10^5$ | $2 \times 10^5$ | $8 \times 10^5$ | $2 \times 10^5$ |
|  |  | 50° C. | $1 \times 10^6$ | $3 \times 10^5$ | $1 \times 10^6$ | $3 \times 10^5$ |
|  |  | 60° C. | $1 \times 10^6$ | $3 \times 10^5$ | $1 \times 10^6$ | $3 \times 10^5$ |
|  |  | 100° C. | $1 \times 10^6$ | $3 \times 10^5$ | $1 \times 10^6$ | $3 \times 10^5$ |
|  |  | Decrease in modulus | Not observed | Not observed | Not observed | Not observed |
|  | Number of generated cracks and peelings | After curing | 6 | 2 | 6 | 3 |
|  |  | After moisture absorption reflow | Not investigated | 6 | Not investigated | 6 |

As can be seen in Table 1 and Table 2, the compositions in the examples 1 to 12 can provide cured products with high hardness, and storage moduli of the cured produces are easily and greatly decreased by heating. Consequently, it is found that the use of the compositions makes it possible to relax the stress generated during heat curing and during moisture absorption reflow, and improve generation of cracks and peelings from the substrates so as to greatly improve the reliability of a semiconductor device such as an LED and the like.

The present invention has been described in detail while referring to specific embodiments, but, it is obvious for a person skilled in the art that the invention can be variously modified and changed without departing from the scope and the spirit of the present invention.

What is claimed is:

1. A method of manufacturing a silicone composition for sealing a semiconductor comprising:
a step of subjecting a first organosiloxane represented by an average unit formula: $(R^1SiO_{3/2})_a(R^1{}_2SiO_{2/2})_b(R^1SiO_{(3-n)/2}Y_n)_c(R^1{}_2SiO_{(2-m)/2}Y_m)_d$, a second organosiloxane represented by a formula: $(R^{23}SiO_{1/2})_2(R^2{}_2SiO_{2/2})_e$, and a third organosiloxane represented by a formula: $(R^2{}_2SiO_{2/2})_f$ at a weight ratio (%) to g:h:i to block polymerization or graft polymerization and equilibration reaction to obtain a polyorganosiloxane (A) having one or more alkenyl groups, (where, $R^1$ represents an alkyl group or an aryl group, $R^2$ represents an alkenyl group, an alkyl group, or an aryl group, Y represents an alkoxy group or a hydroxyl group, n is 1 or 2, m is 1, a is a positive number, b is a positive number, c is 0 or a positive number, d is 0 or a positive number, which are numbers satisfying a+b+c+d=1.0, $0.2<(a+c)/(a+b+c+d)<0.8$, $0.2<(b+d)/(a+b+c+d)<0.8$, $0≤c/(a+b+c+d)<0.15$, $0≤d/(a+b+c+d)<0.15$, e is 0 or a positive number, f is a positive number, which are numbers satisfying $0≤e≤100$, $3≤f≤20$, g, h, i are numbers satisfying $60≤g≤99$, $0≤h≤20$, $0≤i≤20$, and g+h+i=100), a step of mixing or compounding 100 parts by weight of the polyorganosiloxane (A), an amount of a polyorganohydrogensiloxane (B) having two or more hydrogen atoms bonded to silicone atoms per molecule and having a viscosity at 25° C. of 1 to 100 mPa·s so that an amount of the hydrogen atoms bonded to the silcon atoms is 0.5 to 3.0 mol per mol of the alkenyl groups bonded to silicon atoms in the (A) component, and a catalyst amount of a platinum-based catalyst (C).

2. A method of manufacturing a silicone composition for sealing a semiconductor comprising a step of block polymerizing or graft polymerizing and equilibration reacting including a step (1) and a step (2) to obtain a polyorganosiloxane (A) having one or more alkenyl groups, a step of mixing or compounding 100 parts by weight of the polyorganosiloxane (A), an amount of a polyorganohydrogensiloxane (B) having two or more hydrogen atoms bonded to silicone atoms per molecule and having a viscosity at 25° C. of 1 to 1000 mPa·s so that an amount of the hydrogen atoms bonded to the silicon atoms is 0.5 to 3.0 mol per mol of the alkenyl groups bonded to silicon atoms in the (A) component, and a catalyst amount of a platinum-based catalyst (C), the step (1) being a step of polymerizing, in the presence of a basic catalyst, a polyorganosiloxane obtained by hydrolyzing or partially hydrolyzing, under acid condition, a silane compound represented by a formula: $R^1SiX_3$ and $R^1_2SiX_2$ (where $R^1$ represents an alkyl group or an aryl group, X represents a halogen group, an alkoxy group, or a hydroxyl group), to obtain a polyorganosiloxane (I) represented by an average unit formula: $(R^1SiO_{3/2})_a(R^1_2SiO_{2/2})_b(R^1SiO_{(3-n)/2}Y_n)_c(R^1_2SiO_{(2-m)/2}Y_m)_d$ (where, Y represents an alkoxy group or a hydroxyl group, n is 1 or 2, m is 1, a is a positive number, b is a positive number, c is 0 or a positive number, and d is 0 or a positive number, which are numbers satisfying a+b+c+d=1.0, $0.2<(a+c)/(a+b+c+d)<0.8$, $0.2<(b+d)/(a+b+c+d)<0.8$, $0<c/(a+b+c+d)<0.15$, $0≤d/(a+b+c+d)<0.15$); and the step (2) being a step of subjecting the linear polyorganosiloxane (II) containing an alkenyl group represented by a formula: $(R^2_3SiO_{1/2})_2(R^2_2SiO_{2/2})_e$ (where $R^2$ represents an alkenyl group, an alkyl group, or an aryl group, and e is 0 or a positive number satisfying $0≤e≤100$) and/or the cyclic polyorganosiloxane containing an alkenyl group represented by a formula: $(R^2_2SiO)_f$ (where $R^2$ is as described above, and f is a positive number satisfying $3≤f≤20$) with the polyorganosiloxane (I), in the presence of a basic catalyst, to block polymerization or graft polymerization and equilibration reaction.

* * * * *